US008639294B2

(12) United States Patent
Bharitkar et al.

(10) Patent No.: US 8,639,294 B2
(45) Date of Patent: Jan. 28, 2014

(54) SYSTEM AND METHOD FOR PERFORMING AUTOMATIC GAIN CONTROL IN MOBILE PHONE ENVIRONMENTS

(75) Inventors: Sunil Bharitkar, Los Angeles, CA (US); Nathan Dahlin, Los Angeles, CA (US); Ismael Hamad Nawfal, Los Angeles, CA (US)

(73) Assignee: Audyssey Laboratories, Inc., Los Angeles, CA (US)

( * ) Notice: Subject to any disclaimer, the term of this patent is extended or adjusted under 35 U.S.C. 154(b) by 113 days.

(21) Appl. No.: 13/461,774

(22) Filed: May 1, 2012

(65) Prior Publication Data
US 2013/0295868 A1 Nov. 7, 2013

(51) Int. Cl.
*H04B 1/38* (2006.01)

(52) U.S. Cl.
USPC ..... 455/563; 455/296; 455/569.1; 455/550.1; 704/223; 704/225

(58) Field of Classification Search
USPC ............ 455/296, 569.1, 563, 550.1; 704/223, 704/225
See application file for complete search history.

(56) References Cited

U.S. PATENT DOCUMENTS

| | | | |
|---|---|---|---|
| 4,829,565 A | 5/1989 | Goldberg | |
| 5,526,419 A | 6/1996 | Allen et al. | |
| 5,896,450 A | 4/1999 | Kurihara | |
| 5,912,965 A | 6/1999 | Boyer | |
| 6,094,481 A | 7/2000 | Deville et al. | |
| 6,766,176 B1 | 7/2004 | Gupta et al. | |
| 6,834,107 B1 | 12/2004 | Hurst | |
| 7,242,763 B2 | 7/2007 | Etter | |
| 8,489,393 B2 * | 7/2013 | Alves et al. | 704/219 |
| 2010/0121635 A1 * | 5/2010 | Erell | 704/225 |
| 2010/0184487 A1 * | 7/2010 | Takada | 455/569.1 |
| 2013/0218560 A1 * | 8/2013 | Hsiao et al. | 704/233 |

* cited by examiner

*Primary Examiner* — Sanh Phu
(74) *Attorney, Agent, or Firm* — Kenneth L. Green

(57) ABSTRACT

A Dynamic Noise Compensation (DNC) telephone speech enhancement algorithm addresses the issue of environment noise on the listener end of a telephone call. A single microphone proximal to the listener provides a sample of near end ambient noise level and of near end speech. A Voice Activity Detector (VAD) detects the presence of near end (listener) speech. The DNC algorithm adjusts the far end incoming speech level based on the near end ambient noise and the VAD ensures that the near end listener speech does not effect the incoming speech level adjustment.

20 Claims, 4 Drawing Sheets

SYSTEM AND METHOD FOR PERFORMING AUTOMATIC GAIN CONTROL IN MOBILE PHONE ENVIRONMENTS

BACKGROUND OF THE INVENTION

The present invention relates to audio communications processing and in particular to controlling the gain applied to an audio signal provided by a telephone handset.

Telephone conversations are often hampered by ambient noise which often makes it difficult for a near end listener to hear and understand the far end acoustic signal produced by the telephone. In particular, cell phones are replacing hard wired phones in increasing numbers and many phone users now rely entirely on their cell phone. Additionally, cell phones have tended to become smaller and thinner over time, and the current generation of smart cell phones are very thin. Such small and thin cell phones leave no room for a cupped region around the speaker to at least somewhat block ambient noise and the wireless portable nature of cell phones results in their use in many environments including noisy outdoor areas and busy shopping areas. As a result, it is often very difficult for a phone user to hear and understand the incoming signal.

BRIEF SUMMARY OF THE INVENTION

The present invention addresses the above and other needs by providing a Dynamic Noise Compensation (DNC) telephone speech enhancement algorithm which addresses the issue of near end environment noise on the listener end of a telephone call. A single microphone proximal to the listener provides a sample of near end ambient noise level and of near end speech. A Voice Activity Detector (VAD) detects the presence of near end (listener) speech. The DNC algorithm adjusts the incoming speech level based on the near end ambient noise and the VAD ensures that the near end listener speech does not effect the incoming speech level adjustment.

In accordance with one aspect of the invention, there is provided a DNC which receives three inputs: a near end speech plus ambient noise signal provided by a single microphone; a VAD signal; and the far end speech level signal of the far end speech signal being received by the near end user. The near end speech plus ambient noise signal is used to compute a near end noise level estimate. The local noise level estimate serves as input to a lookup table used to generate gains applied to the far end speech. The VAD serves as a control input to logic governing post processing of the lookup table output and, in some configurations, pre-processing of the local noise level estimate prior to the lookup table. The output of the algorithm is a final scalar gain applied to the incoming far end speech signal to generate a compensated far end speech signal.

In accordance with another aspect of the invention, there is provided a frequency domain method for computing the local noise level estimate. The frequency domain method uses the noise power spectral density estimation technique presented by Rainer Martin in "Noise Power Spectral Density Estimation Based on Optimal Smoothing and Minimum Statistics" IEEE Trans. Speech and Audio Processing, 9(5):504-512, July 2001. On a bin by bin bases, the technique keeps a running update of detected minima, incorporating minimum statistics in the final estimate in order to avoid underestimating the noise level. This process is carried out in the power domain, in order to arrive at a scalar amplitude estimation for use in DNC, the mean of the square roots of this spectral density estimation is taken and used as input to the lookup table.

In accordance with yet another aspect of the invention, there is provided a time domain method for computing the local noise level estimate. The time domain method applies an Infinite Impulse Response (IIR) approximation of a ITU-R 468 weighting curve to the input. Following this weighting, the RMS average is taken over the input frame to arrive at a scalar amplitude estimate.

BRIEF DESCRIPTION OF THE SEVERAL VIEWS OF THE DRAWING

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing one or more preferred embodiments of the invention. The scope of the invention should be determined with reference to the claims.

Figure 1:
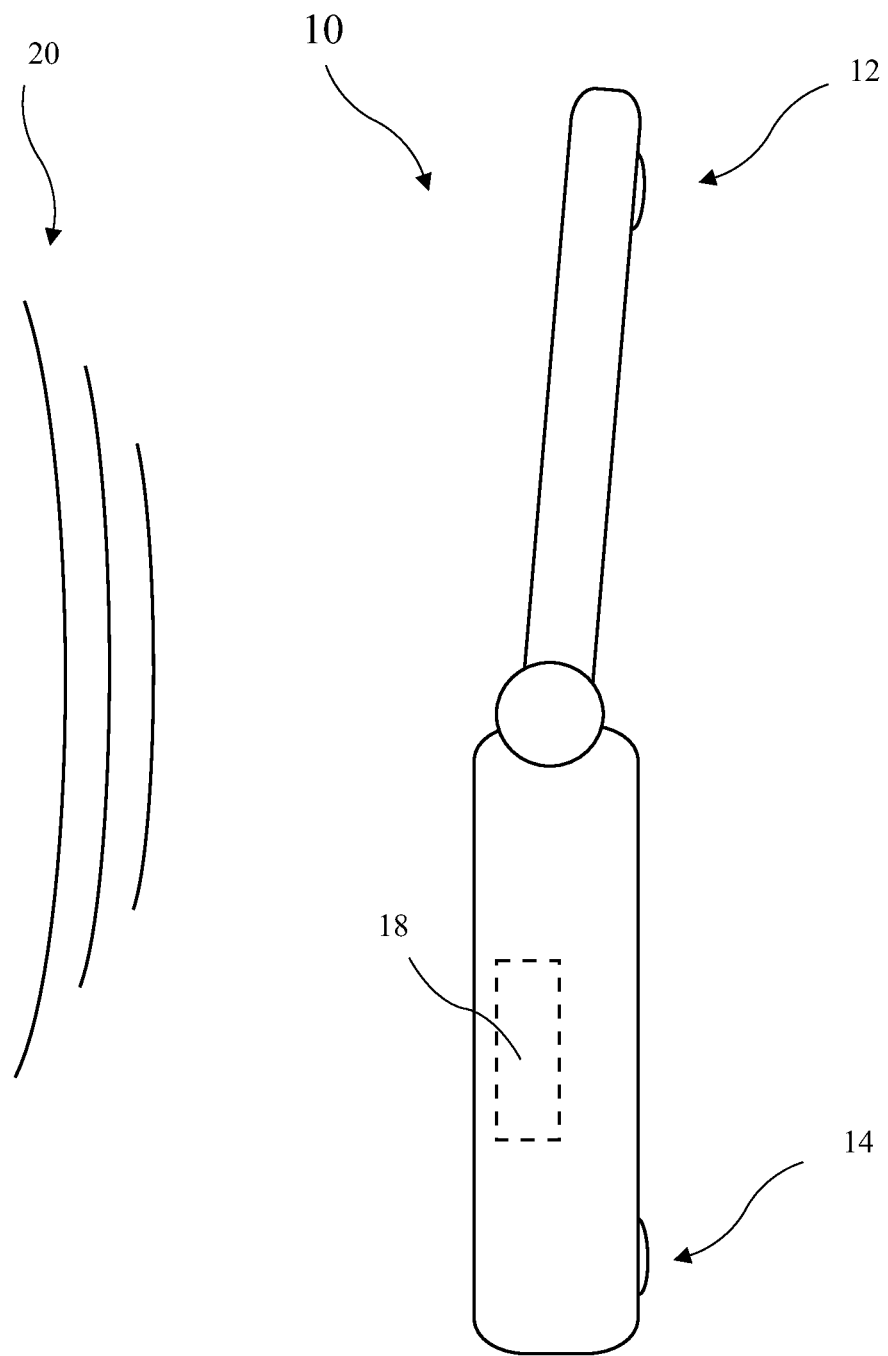
FIG. 1 is a telephone according to the present invention.

A telephone 10 including Dynamic Noise Compensation (DNC) processing according to the present invention is shown in FIG. 1. The telephone 10 may be a cell phone, a wireless phone (i.e., a phone receiving signals from a local base station which is hardwired, or a handset of a hardwired phone. The telephone 10 includes a speaker 12 for broadcasting an incoming far end speech signal, a microphone 14 for receiving the near end user's speech and ambient noise, and a signal processor 18 for performing DNC processing of the far end speech signal and the near end user's speech and ambient noise signal, to produce a compensated far end speech signal provided to the speaker 12. When the telephone is a cell phone, a signal 20 is received and processed to generate the far end speech signal.

Figure 2:
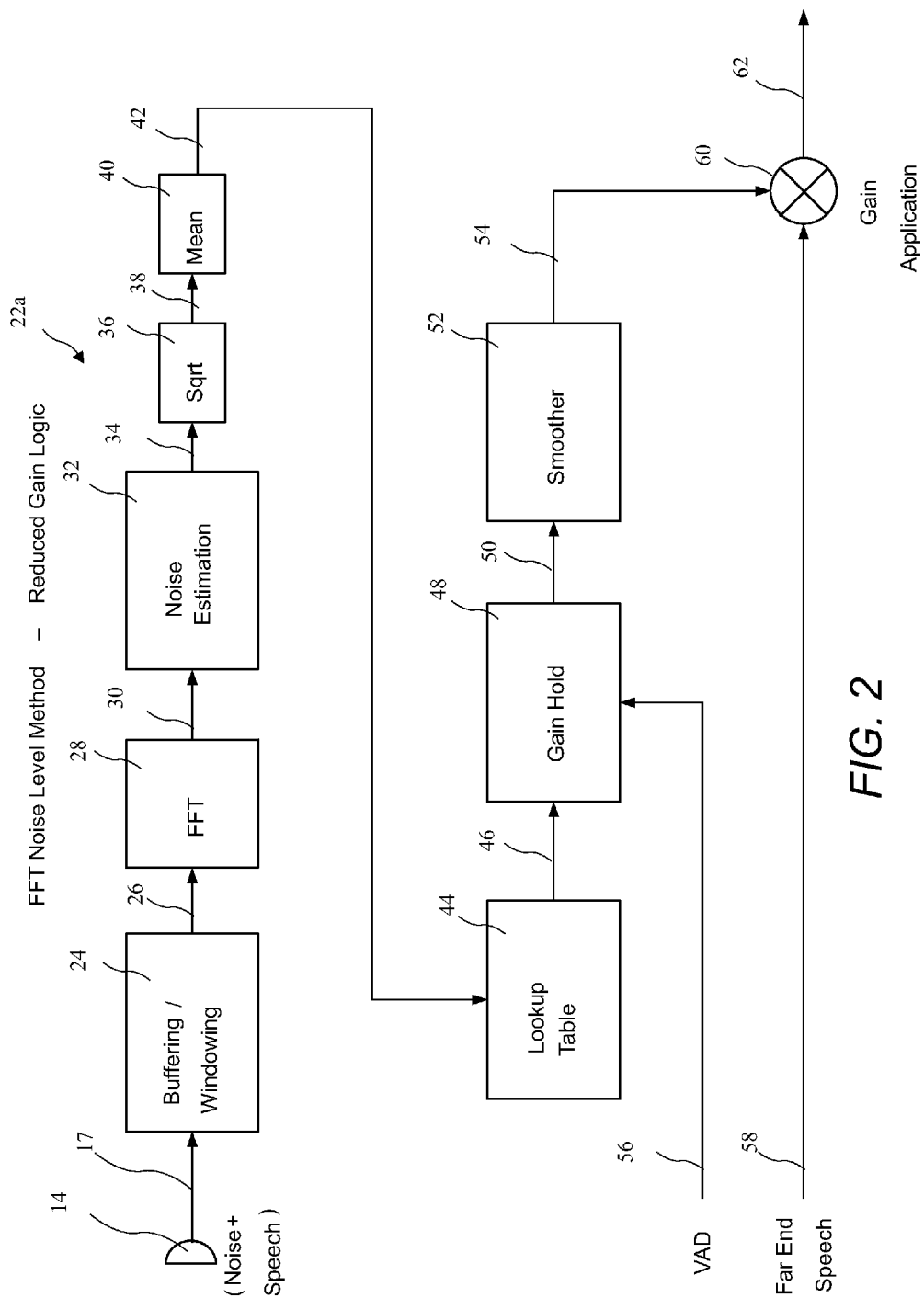
FIG. 2 describes a frequency domain embodiment of Dynamic Noise Compensation (DNC) according to the present invention.

One processing method for DNC is a frequency domain method 22a shown in FIG. 2. The method 22a includes buffering/windowing 24, FFT 28, noise estimation 32, sqrt 36, mean 40, lookup table 44, gain hold 48, smoother 52, and gain application 60. The buffering/windowing 24 receives a near end speech plus ambient noise signal 17 generated by the microphone 14 and generates near end speech plus noise data frames 26. The near end speech plus noise data frames 26 are processed by the FFT 28 to generate near end signal frequency domain data frames 30. The near end signal frequency domain data frames 30 is processed by noise estimation 32 to generate frequency domain noise bin estimates 34. Square roots 38 of the frequency domain noise bin estimates 34 are computed by sqrt 36 and a scalar mean 42 of the square root of the frequency domain noise bin estimates 38 is computed by mean 40. The scalar mean 42 is an input to the lookup table 44 to obtain a gain 46.

The noise estimate 32 preferably uses the noise power spectral density estimation technique presented by Rainer Martin in "Noise Power Spectral Density Estimation Based on Optimal Smoothing and Minimum Statistics" IEEE Trans. Speech and Audio Processing, 9(5):504-512, July 2001. On a bin by bin bases, the technique keeps a running update of detected minima, incorporating minimum statistics in the final estimate in order to avoid underestimating the noise level. The noise estimate 32 operates in the power domain.

The gain 46 and a Voice Activity Detection (VAD) parameter 56 are provided to the gain hold 48 and used to determine a modified gain 50. The extent to which a VAD parameter 56 is incorporated into DNC depends on the noise estimation method being used. The frequency domain noise level estimate method 22a is far less sensitive to rapidly changing noise inputs than the time domain method described in FIG. 3. The VAD parameter 56 is preferably obtained by methods disclosed in U.S. patent application Ser. No. 13/461,770 filed May 1, 2012 by the present applicant, herein incorporated by reference in its entirety. In the method 22a, the modified gain 50 is set to the gain 46 when the VAD parameter 56 is set to "0" (near end speech not present) and the modified gain 50 is held to the current value when VAD parameter 56 is set to "1" (near end speech present). The modified gain 50 is smoothed by the smoother 52 to provide a smoothed gain 54, and the far end speech signal 58 is scaled by the smoothed gain 54 in gain application 60 to provide a compensated far end signal 62 to the near end listener.

Figure 3:
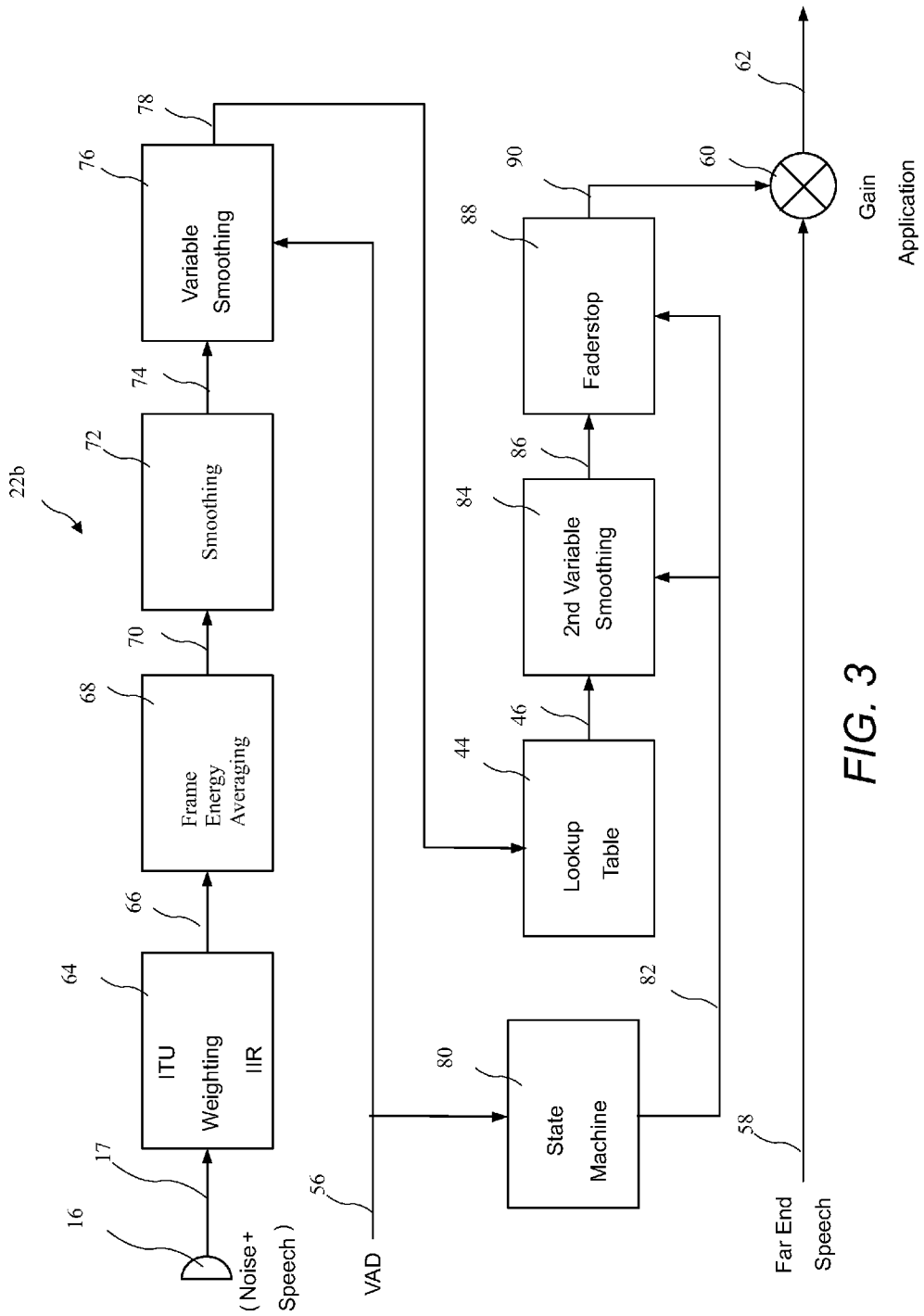
FIG. 3 describes a time domain embodiment of DNC according to the present invention.
Figure 4:
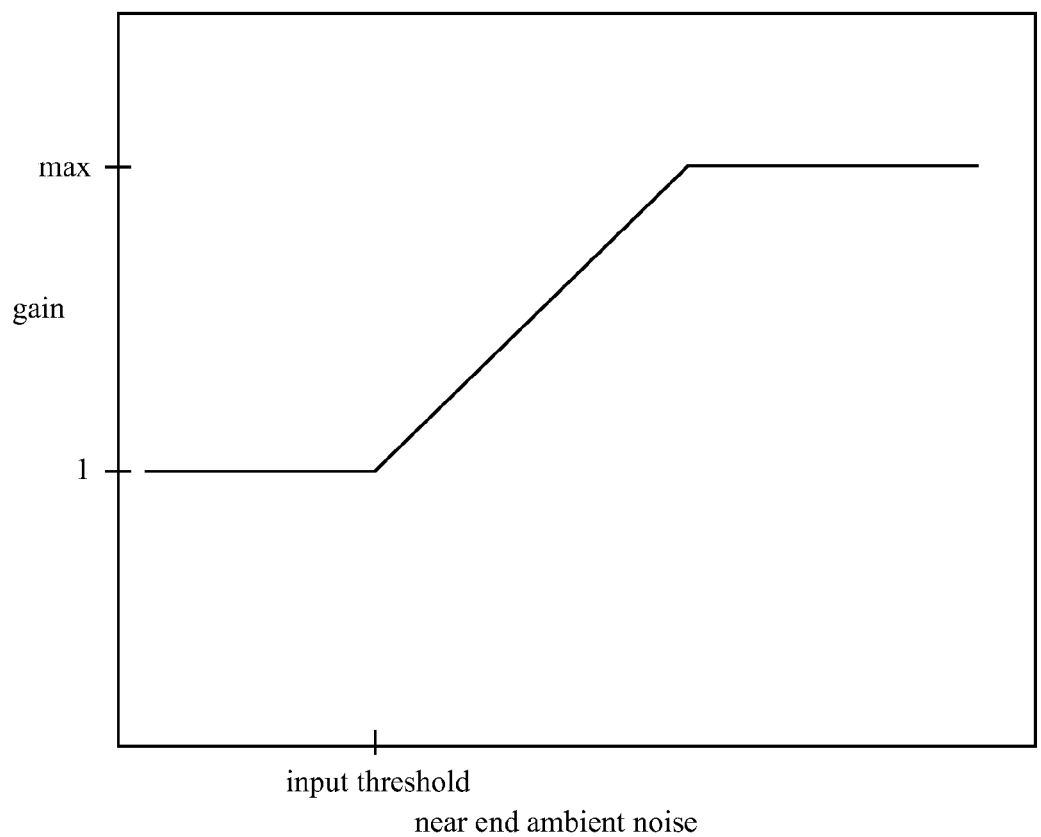
FIG. 4 is a graphical representation of a gain look-up table according to the present invention.

In a second embodiment 22b shown in FIG. 3, the near end signal 17 generated by the microphone 14 is processed in the time domain to produce the local signal estimate. The time domain method 22b includes a weighting curve 64, frame energy averaging 68, smoothing 72, variable smoothing 76, state machine 80, lookup table 44, second variable smoothing 84, faderstop 88, and the gain application 60. The weighting curve 64 receives the near end ambient noise signal 17 and generates a weighted (or filtered) signal 66. The weighted signal 66 is processed by the frame energy averaging 68 to generate a single value averaged signal 70 for each frame of data. The averaged signal 70 is smoothed by smoothing 72 to produce a smoothed signal 74.

While other weighting curves may be used, the weighting curve 64 is preferably an Infinite Impulse Response (IIR) approximation of the International Telecommunication Union (ITU) ITU-R 468 standard is a preferred weighting curve. Following applying the weighting curve to the ambient noise signal, the RMS average is taken over the input frame to arrive at a scalar local noise level estimate.

The smoothed signal 74 is further smoothed by the variable smoothing 76 to produce a variably smoothed signal 78. The variable smoothing 76 is preferably single pole variable smoothing. For example, with single pole variable smoothing the smoothed output is composed of weighted values of the current input and the previous smoothed output where the weights sum to one. The weight are determined by the amount of time desired for the smoothed output to rise or fall, and thus termed time constants. Often, the time constant applied for an increasing signal is different from that for a decreasing signal.

The variable smoothing 76 further receives the VAD parameter 56 which serves as a selector between two sets of time constants governing the behavior of the variable smoother 76. In a first number N1 of frames received by the variable smoothing 76 following a negative edge switching from 1 to 0 in the VAD parameter 56, a faster set of time constants are used to smooth the incoming noise estimate, the number N1 is preferably about 30. This is intended to allow the estimated noise level value to decay or rise quickly to noise levels that might either have changed significantly during speech activity, or extremely low levels of ambient noise.

The variably smoothed signal 78 is processed by the lookup table 44 in the same manner as in the frequency domain method 22a to generate the gain 46. The gain 46 is processed by the second variable smoothing 84 to generate a smoothed gain 86. The smoothed gain 86 is processed by the faderstop 88 to generate a modified gain 90. The far end speech signal 58 is scaled by the modified gain 90 in gain application 60 to provide a compensated far end signal 62 to the near end listener.

The VAD parameter 56 is processed by the state machine 80 which uses a lookahead delay of preferably about three frames, and more preferably three frames, to set the state of the current frame 82 to one of four states: speech coming, speech ending, speech, non speech. The second variable smoothing 84 (e.g., single pole smoothing) processes the gain 46 based on the state of the current frame 82. Corresponding to the four states of the current frame 82 listed above, the variable smoothing 84 performs in the following manner:

Speech Coming: set the smoothed gain 86 to the gain 46;
Speech Ending: compute the smoothed gain 86 using time constants adjusted to respond quickly to post speech levels;
No Speech: compute the smoothed gain 86 using Speech Ending time constants for the first N2 frames (where N2 is preferably about ten), followed by use of default smoothing constants; and
Speech: compute the smoothed gain 86 in the faderstop 88.

The faderstop 88 further processes the smoothed gain 86 based on the state of the current frame 82 in the following manner:

Speech Coming: set the modified gain 90 to the smoothed gain 86 received from the second variable smoothing 84;
Speech Ending: set the modified gain 90 to the smoothed gain 86 received from the second variable smoothing 84;
No Speech: Compute the modified gain 90 using a slower release constant the first N3 frames (where N3 is preferably about ten), followed by use of default smoothing constants; and
Speech: set the modified gain 90 to the last smoothed gain 86 prior to speech.

While the invention herein disclosed has been described by means of specific embodiments and applications thereof, numerous modifications and variations could be made thereto by those skilled in the art without departing from the scope of the invention set forth in the claims.

We claim:

1. A method for dynamic noise compensation, the method comprising:
    receiving a speech plus noise signal in a microphone;
    generating a level of the speech plus noise signal;
    mapping the level of the speech plus noise signal into a gain;
    using a near end Voice Activity Detection (VAD) method to determine if a near end listener is speaking;
    determining a modified gain based on the gain and on the VAD; and
    applying the modified gain to a far end speech signal.

2. The method of claim 1, wherein generating a level of the speech plus noise signal comprises:
    creating a time domain frame of the speech plus noise signal;
    transforming the time domain frame into a frequency domain frame; and
    estimating the near end ambient noise level from the frequency domain frame.

3. The method of claim 2, further including:
    taking the square root and mean of the near end ambient noise level; and using a lookup table to map the square root and mean of the near end ambient noise level into the gain.

4. The method of claim 2, wherein the modified gain is set to the gain when the VAD parameter is set to "0" (near end speech not present) and the modified gain is held to the current value of the modified gain when VAD parameter 56 is set to "1" (near end speech present).

5. The method of claim 4, further including smoothing the modified gain before applying the modified gain to a far end speech signal.

6. The method of claim 5, wherein generating a near end ambient noise level comprises performing noise power spectral density estimation on the frequency domain frames.

7. The method of claim 6, wherein performing noise power spectral density estimation comprises:
on a bin by bin bases, keeping a running update of detected minima; and
incorporating minimum statistics in the final estimate in order to avoid underestimating the noise level.

8. The method of claim 7, wherein the noise power spectral density estimation operates in the power domain.

9. The method of claim 1, wherein generating a level of the speech plus noise signal comprises averaging the frame energy of a time domain speech plus noise signal.

10. The method of claim 9, further including processing the speech plus noise signal with a weighting curve before averaging the frame energy of the time domain speech plus noise signal.

11. The method of claim 10, wherein the processing the speech plus noise signal with a weighting curve comprises processing the speech plus noise signal with an Infinite Impulse Response (IIR) filter.

12. The method of claim 10, wherein the IIR filter comprises an approximation of the International Telecommunication Union (ITU) ITU-R 468 standard is a preferred weighting curve.

13. The method of claim 12, wherein the frame energy averaging comprises generating a single value averaged frame energy signal for each time domain frame of data.

14. The method of claim 13, further including smoothing the single value averaged frame energy signal.

15. The method of claim 14, further including variably smoothing the smoothed the single value averaged frame energy signal using single pole variable smoothing.

16. The method of claim 15, wherein:
the variable smoothing receives a VAD parameter which serves as a selector between two sets of time constants governing the behavior of the variable smoother; and
in a first number N1 of frames received by the variable smoothing following a negative edge switching from 1 to 0 in the VAD parameter, a faster set of time constants are used to smooth the incoming noise estimate, for allowing the estimated noise level value to decay or rise quickly to noise levels that might either have changed significantly during speech activity, or extremely low levels of ambient noise.

17. The method of claim 16, further including:
processing the VAD parameter by a state machine using a lookahead delay to set the state of a current frame to one of four states selected from speech coming, speech ending, speech, and non speech;
providing the variably smoothed single value averaged frame energy to a lookup table to map the variably smoothed single value averaged frame energy into a gain;
providing the state and the gain to a second variable smoothing performing in the following manner:
if the state is speech coming, set a modified gain to the gain;
if the state is speech ending, compute the modified gain using time constants adjusted to respond quickly to post speech levels;
if the state is non speech, for a second number N2 of frames, compute the modified gain using speech ending time constants, followed by use of defaults smoothing constants; and
if the state is speech, perform no smoothing of the gain.

18. The method of claim 17, further including applying faderstop processing to the modified gain in the following manner:
if the state is speech coming, applying the smoothed gain received from the second variable smoothing to the far end speech signal;
if the state is speech ending, applying the smoothed gain received from the second variable smoothing to the far end speech signal;
if the state is non speech, for a third number N3 of frames, use a slower release constant, followed by use of default smoothing constants; and
if the state is speech, hold the gain to the last smoothed gain prior to speech.

19. A method for dynamic noise compensation, the method comprising:
receiving a speech plus noise signal in a microphone;
creating a time domain frame of the speech plus noise signal;
transforming the time domain frame into a frequency domain frame; and
estimating the near end ambient noise level from the frequency domain frame using noise power spectral density estimation in the power domain, comprising:
on a bin by bin bases, keeping a running update of detected minima; and
incorporating minimum statistics in the final estimate in order to avoid underestimating the noise level;
taking the square root and mean of the near end ambient noise level and using a lookup table to map the result into the gain;
using a near end Voice Activity Detection (VAD) method to determine if a near end listener is speaking;
setting a modified gain to the gain when the VAD parameter is set to "0" (near end speech not present) and holding the modified gain to the current value when VAD parameter 56 is set to "1" (near end speech present);
smoothing the modified gain; and
applying the modified gain to a far end speech signal.

20. A method for dynamic noise compensation, the method comprising:
receiving a speech plus noise signal in a microphone;
applying an Infinite Impulse Response (IIR) approximation of the International Telecommunication Union (ITU) ITU-R 468 standard weighting curve to the speech plus noise signal;
forming time domain input frames;
taking the RMS average over the time domain input frame to arrive at a scalar local noise level estimate;
creating a time domain speech plus noise signal frame from the speech plus noise signal;
averaging the frame energy of a time domain speech plus noise signal frame to obtain a single value averaged frame energy;
applying single pole variable smoothing to the averaged single value averaged frame energy, wherein:

the variable smoothing receives a near end Voice Activity Detection (VAD) parameter which serves as a selector between two sets of time constants governing the behavior of the variable smoother;

in a first number of frames N1 received by the variable smoothing following a negative edge switching from 1 to 0 in the VAD parameter, a fast set of time constants is used to smooth the averaged single value averaged frame energy, for allowing the estimated noise level value to decay or rise quickly to noise levels that might either have changed significantly during speech activity, or extremely low levels of ambient noise;

processing the VAD parameter by a state machine using a lookahead delay to set the state of a current frame to one of four states selected from speech coming, speech ending, speech, and non speech;

providing the variably smoothed averaged single value averaged frame energy to the lookup table to map the variably smoothed averaged single value averaged frame energy into a gain;

providing the state and the gain to a second variable smoothing to compute a modified gain in the following manner:
   if the state is speech coming, set a modified gain to the gain;
   if the state is speech ending, compute the modified gain using time constants adjusted to respond quickly to post speech levels;
   if the state is non speech, for a second number N2 of frames, compute the modified gain using speech ending time constants, followed by use of defaults smoothing constants; and
   if the state is speech, setting the modified gain to the last smoothed gain;

applying faderstop processing to the modified gain in the following manner:
   if the state is speech coming, setting the smoothed gain to the smoothed gain received from the second variable smoothing;
   if the state is speech ending, setting the smoothed gain to the smoothed gain received from the second variable smoothing;
   if the state is non speech, for a third number of frames N3, processing the modified gain using a slower release constant, followed by use of default smoothing constants; and
   if the state is speech, setting the modified gain to the last modified gain prior to speech; and applying the modified gain to a far end speech signal.

* * * * *